US010886450B2

(12) United States Patent
Kim et al.

(10) Patent No.: US 10,886,450 B2
(45) Date of Patent: Jan. 5, 2021

(54) THERMOELECTRIC COMPOSITE MATERIAL COMPRISING MXENE AND METHOD FOR MANUFACTURING THE SAME

(71) Applicant: KOREA INSTITUTE OF SCIENCE AND TECHNOLOGY, Seoul (KR)

(72) Inventors: Jin-Sang Kim, Seoul (KR); Chong-Min Koo, Seoul (KR); Seung-Hyub Baek, Seoul (KR); Seong-Keun Kim, Seoul (KR); Chong-Yun Kang, Seoul (KR); Soon-Man Hong, Seoul (KR); Seung-Sang Hwang, Seoul (KR); Ji-Won Choi, Seoul (KR); Seok-Jin Yoon, Seoul (KR); Kwang-Chon Kim, Seoul (KR); Kyung-Youl Baek, Seoul (KR); Sang-Ho Cho, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 359 days.

(21) Appl. No.: 15/996,706

(22) Filed: Jun. 4, 2018

(65) Prior Publication Data
US 2019/0189884 A1 Jun. 20, 2019

(30) Foreign Application Priority Data

Dec. 18, 2017 (KR) .......................... 10-2017-0174387

(51) Int. Cl.
H01L 35/24 (2006.01)
H01L 35/16 (2006.01)
C04B 35/547 (2006.01)
C04B 35/628 (2006.01)
H01L 35/18 (2006.01)
C04B 35/58 (2006.01)
C04B 35/626 (2006.01)
C04B 35/01 (2006.01)
C04B 35/645 (2006.01)
H01L 35/22 (2006.01)
C04B 35/56 (2006.01)

(52) U.S. Cl.
CPC .............. H01L 35/24 (2013.01); C04B 35/01 (2013.01); C04B 35/547 (2013.01); C04B 35/5607 (2013.01); C04B 35/5611 (2013.01); C04B 35/5622 (2013.01); C04B 35/58007 (2013.01); C04B 35/58014 (2013.01); C04B 35/58021 (2013.01); C04B 35/58028 (2013.01); C04B 35/58035 (2013.01); C04B 35/58085 (2013.01); C04B 35/628 (2013.01); C04B 35/6264 (2013.01); C04B 35/62831 (2013.01); C04B 35/62886 (2013.01); C04B 35/645 (2013.01); H01L 35/16 (2013.01); H01L 35/18 (2013.01); H01L 35/22 (2013.01); C04B 2235/3294 (2013.01); C04B 2235/3298 (2013.01); C04B 2235/3817 (2013.01); C04B 2235/3839 (2013.01); C04B 2235/3843 (2013.01); C04B 2235/3852 (2013.01); C04B 2235/3856 (2013.01); C04B 2235/3886 (2013.01); C04B 2235/446 (2013.01); C04B 2235/5292 (2013.01); C04B 2235/5445 (2013.01); C04B 2235/666 (2013.01); C04B 2235/85 (2013.01)

(58) Field of Classification Search
CPC ......... H01L 35/24; H01L 35/16; H01L 35/22; H01L 35/18; C04B 35/58085; C04B 35/01; C04B 35/547
See application file for complete search history.

(56) References Cited

U.S. PATENT DOCUMENTS 8,377,590 B2 * 2/2013 Park ...................... H01G 11/36
429/213

FOREIGN PATENT DOCUMENTS

KR 10-2016-0126558 A 11/2016
WO WO 2019/055784 * 3/2019

OTHER PUBLICATIONS

Peng-an Zong et al., "Skutterudite with graphene-modified grain-boundary complexion enhances zT enabling high-efficiency thermoelectric device", Energy & Environmental Science, 2017, pp. 183-191, vol. 10.

* cited by examiner

Primary Examiner — C Melissa Koslow
(74) Attorney, Agent, or Firm — Rabin & Berdo, P.C.

(57) ABSTRACT

Disclosed is a thermoelectric composite material includes a thermoelectric material including crystal grains; and a MXene inserted at boundaries of the crystal grains consisting of the thermoelectric material. Accordingly, the thermoelectric composite material may have a reduced thermal conductivity and an increased electrical conductivity. Furthermore, mechanical properties of the thermoelectric composite material may be improved. Thus, the thermoelectric composite material may improve the thermoelectric ability of a thermoelectric module including the same. A method of manufacturing the thermoelectric composite material includes coating MXene on a surface of a thermoelectric material powder including crystal grains; and sintering the thermoelectric material powder coated with the MXene to form a sintered body including the MXene inserted at boundaries of the crystal grains consisting of the thermoelectric material.

13 Claims, 9 Drawing Sheets
(5 of 9 Drawing Sheet(s) Filed in Color)

THERMOELECTRIC COMPOSITE MATERIAL COMPRISING MXENE AND METHOD FOR MANUFACTURING THE SAME

CROSS-REFERENCE TO RELATED APPLICATIONS

This application claims priority under 35 U.S.C. § 119 to Korean Patent Application No. 10-2017-0174387, filed on Dec. 18, 2017, and all the benefits accruing therefrom, the content of which is herein incorporated by reference in its entirety.

BACKGROUND

1. Field

Exemplary embodiments relate to a thermoelectric material. More particularly, exemplary embodiments relate to a thermoelectric composite material including MXene and a method for manufacturing the thermoelectric composite material.

2. Description of the Related Art

A thermoelectric material is an energy-converting material in which an electric energy is generated when a temperature difference is provided to its both ends, and in which a temperature difference occurs between the both ends when electric energy is provided thereto.

A thermoelectric effect may include Seebeck effect, which may be used for thermoelectric generation, and Peltier effect, which may be used for electronic refrigeration. For example, heat that is generated by a computer, an automobile engine or the like may be converted to electric energy by using Seebeck effect. Furthermore, a various refrigeration system without a cooling agent may be embodied by using Peltier effect.

A thermoelectric element using the thermoelectric effect has a simple structure and high stability, and can be easily treated and widely used, for example, for generation using temperature difference, controlling a temperature of a semiconductor laser, cooling a water purifier, cooling a seat of an automobile, manufacturing a small-sized refrigerator or the like. Thus, research and development are being conducted for improving abilities of the thermoelectric element.

Generally, ZT, which is dimensionless figure of merit, may be used for defining an ability of a thermoelectric material. A commercially available thermoelectric material may have ZT equal to or more than 1 in the newest technology, however, a thermoelectric material having ZT equal to or more than 0.5 may be used in a specific field. The ZT may be determined by inherent characteristics of materials, an internal structure depending on a manufacturing method, doping or the like.

A thermoelectric material may be designed to have desired abilities in a specific temperature range. For example, a thermoelectric material may be divided into a low temperature thermoelectric material, which may be used at a temperature equal to or less than about 200° C., a middle temperature thermoelectric material, which may be used at a temperature equal to or less than about 500° C., and a high low temperature thermoelectric material, which may be used at a temperature equal to or more than about 500° C., depending on an operation temperature. For example, an alloy formed from a combination of bismuth (Bi), antimony (Sb), tellurium (Te) and selenium (Se) may be used for the low temperature thermoelectric material. For now, ZT of a commercially available low temperature thermoelectric material is 0.8 to 1.1, and ZT of a thermoelectric element formed from the low temperature thermoelectric material may be 0.7 to 0.9 at a room temperature (25° C.). An alloy of lead (Pb), Te and Se may be used for the middle temperature thermoelectric material. An alloy of silicon (Si) and germanium (Ge), and magnesium silicide ($Mg_2Si$) may be used for the high temperature thermoelectric material, and are being used for manufacturing a prototype of a power generator.

Most of highly efficient thermoelectric materials include Te. For example, $Bi_2Te_3$ may be widely used. A single-crystalline material may be widely used for a thermoelectric element. However, reliability and durability of the thermoelectric element may be deteriorated because a thermoelectric ability may be decreased due to long time operation or because a crack may be caused by difference of expansion coefficient between a thermoelectric material and a substrate. In order to solve such problems, a sintered material formed from powders may be used instead of single-crystalline material. However, because the inherent ability of the sintered material is lower than that of the single-crystalline material, research and development are required for improving a thermoelectric ability. Reasons, why the inherent ability of the sintered material is relatively low, may include electrical conductivity decrease due to electron scattering generated at a boundary of a crystal grain, and composition variance due to volatilization of elements when sintered. Thus, in order to overcome the problems, methods are developed for improving an electrical conductivity and ZT. According to an example of the methods, a different material may be disposed adjacent to a boundary of a crystal grain to form a composite material.

For example, in Korean Patent Publication No. 10-2016-0126558, a graphene is added into a conventional thermoelectric material to be disposed at a gran boundary to inhibit volatilization and interactive diffusion of elements at the gran boundary. However, effects of increasing an inherent ability of the material have not been reported. In Korean Patent Publication No. 10-2016-0126558, a stacked structure of a thermoelectric material and graphene is provided to increase a thermoelectric ability. G. J. Snyder group of Northwestern University in the United States implemented a core-shell structure in which graphene surrounds a thermoelectric material [P.-A. Zong, Energy Environ. Sci. 2017]. However, the above methods cannot be easily performed, and require a long process time to form a thermoelectric material. Furthermore, increase of a thermoelectric ability is hardly large because of oxidation of graphene.

SUMMARY

Exemplary embodiments provide a thermoelectric composite material having a high thermoelectric ability.

Exemplary embodiments provide a method for manufacturing the thermoelectric composite material.

According to an exemplary embodiment, a thermoelectric composite material includes MXene inserted at a boundary of a crystal grain consisting of a thermoelectric material.

In an exemplary embodiment, the thermoelectric material includes at least one selected from the group consisting of a chalcogenide, an antimonide, a silicide, a half-Heusler compound and an oxide.

In an exemplary embodiment, the thermoelectric material includes at least one selected from the group consisting of a Bi—Te compound, a Sb—Te compound, a Bi—Te—Se compound, a Bi—Sb—Te compound and a Bi—Sb—Te—Se compound.

In an exemplary embodiment, the MXene is an inorganic compound having a two-dimensional shape and represented by $M_{n+1}X_n$. M represents Ti, Zr, Hf, V, Cr, Mn, Sc, Mo, Nb, Ta or a combination thereof, X represents C, N or a combination thereof, and n is a natural number of 1 to 3.

In an exemplary embodiment, the MXene forms a continuous thin film surrounding the crystal grain.

In an exemplary embodiment, the MXene is irregularly disposed along the boundary of the crystal grain.

According to an exemplary embodiment, a thermoelectric composite material includes MXene dispersed in a matrix including a conductive polymer.

In an exemplary embodiment, the conductive polymer includes at least one selected from the group consisting of polypyrrole, polyaniline, polycarbazole, polythiophene, poly(3-hexylthiophene) (P3HT), poly(3,4-ethylenedioxythiophene) (PEDOT), and PEDOT:poly(styrene sulfonate) (PSS).

According to an exemplary embodiment, a method of manufacturing a thermoelectric composite material includes coating MXene on a surface of a thermoelectric material powder, and sintering the thermoelectric material powder coated with the MXene to form a sintered body including MXene inserted at a boundary of a crystal grain consisting of a thermoelectric material.

According to exemplary embodiments, a thermal conductivity of the thermoelectric material may be reduced, and an electrical conductivity of the thermoelectric material may be increased. Furthermore, a mechanical property of the thermoelectric material may be improved.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The above and other features and advantages will become more apparent by describing exemplary embodiments thereof with reference to the accompanying drawings, in which.

DETAILED DESCRIPTION

Figure 1:
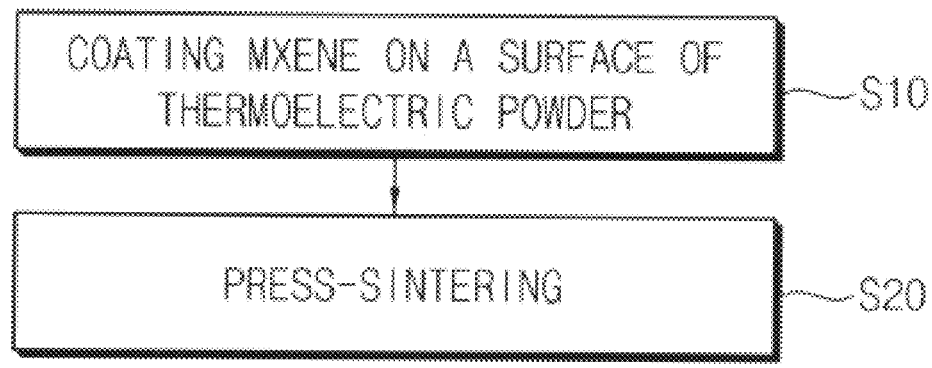
FIG. 1 is a flow chart for explaining a method for manufacturing a thermoelectric composite material according to an exemplary embodiment.

Example embodiments are described more fully hereinafter with reference to the accompanying drawings. The inventive concept may, however, be embodied in many different forms and should not be construed as limited to the example embodiments set forth herein. In the drawings, the sizes and relative sizes of layers and regions may be exaggerated for clarity. It will be understood that, although the terms first, second, third etc. may be used herein to describe various elements, components, regions, layers, patterns and/or sections, these elements, components, regions, layers, patterns and/or sections should not be limited by these terms. These terms are only used to distinguish one element, component, region, layer pattern or section from another region, layer, pattern or section. Thus, a first element, component, region, layer or section discussed below could be termed a second element, component, region, layer or section without departing from the teachings of example embodiments.

Example embodiments are described herein with reference to cross sectional illustrations that are schematic illustrations of illustratively idealized example embodiments (and intermediate structures) of the inventive concept. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of the inventive concept.

The terminology used herein is for the purpose of describing particular example embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
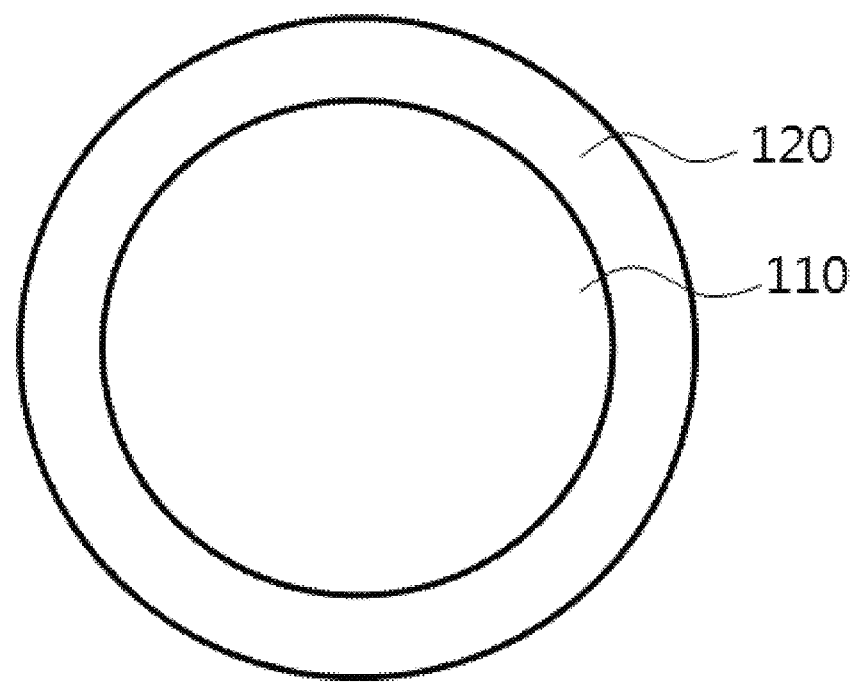
FIG. 2 is a cross-sectional view illustrating a thermoelectric material powder coated with MXene in a method for manufacturing a thermoelectric composite material according to an exemplary embodiment.
Figure 3:
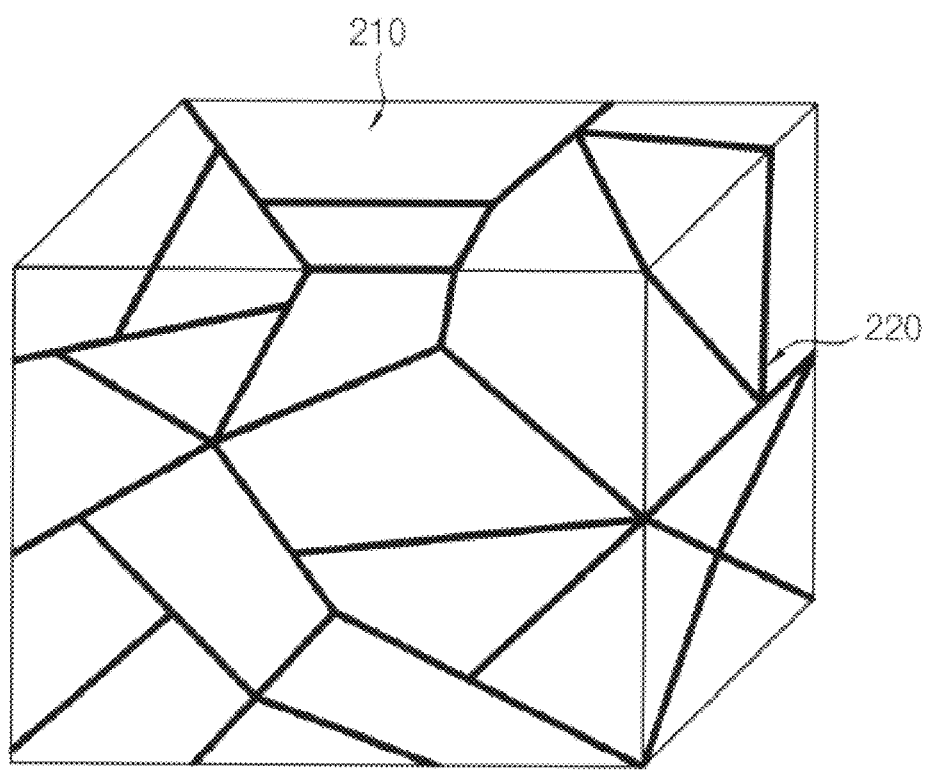
FIG. 3 is a schematic view illustrating a thermoelectric composite material according to an exemplary embodiment.

FIG. 1 is a flow chart for explaining a method for manufacturing a thermoelectric composite material according to an exemplary embodiment. FIG. 2 is a cross-sectional view illustrating a thermoelectric material powder coated with MXene in a method for manufacturing a thermoelectric composite material according to an exemplary embodiment. FIG. 3 is a schematic view illustrating a thermoelectric composite material according to an exemplary embodiment.

Referring to FIG. 1, MXene is coated on a surface of a thermoelectric material powder to form a composite having a core-shell structure.

For example, the thermoelectric material powder may include a chalcogenide, an antimonide, a silicide, a half-Heusler compound, an oxide or a combination thereof.

In an exemplary embodiment, the thermoelectric material powder may include a Bi—Te compound, which is a room temperature thermoelectric material. For example, the thermoelectric material powder may include at least one of a binary compound, a ternary compound and a quaternary compound. For example, the thermoelectric material powder may include may include a Bi—Te compound, a Sb—Te compound, a Bi—Te—Se compound, a Bi—Sb—Te compound and a Bi—Sb—Te—Se compound or a combination thereof. Furthermore, the thermoelectric material powder may be formed to be an N-type, for example, by adding Se into a Bi—Te compound, or may be formed to be a P-type, for example, by adding Sb into a Bi—Te compound. Furthermore, the thermoelectric material powder may be formed to be an N/P type by adding impurities such as $SbI_3$, Cu, Ag, $CuCl_2$ or the like thereto. Furthermore, examples of the thermoelectric material powder may include a plate-shaped material, which a high temperature thermoelectric material, as well as the room temperature thermoelectric material.

The thermoelectric material powder may be obtained by a conventional method. For example, sources of each components of the thermoelectric material powder may be treated by various methods such as ball-milling, mechanical alloying, melt-spinning or the like. A size of the thermoelectric material powder may be several nm to hundreds of μm, however, exemplary embodiments of the present invention are not limited thereto.

MXene is an inorganic compound having a two-dimensional shape, and may have a high strength and a high electrical conductivity. For example, MXene may be defined as a two-dimensional nano material consisting of a transitional metal carbide or a transitional metal nitride, which is represented by $M_{n+1}X_n$, and having a thickness of nanometers and a length of micrometers. M may represent Ti, Zr, Hf, V, Cr, Mn, Sc, Mo, Nb, Ta or a combination thereof, X may represent C, N or a combination thereof, and n may be a natural number of 1 to 3. In an exemplary embodiment, M and X may respectively include a single element such as $Ti_3C_2$. In another exemplary embodiment, M may include two or more transitional metals, and X may include both of C and N, such as $Ti_2MoCN$.

For example, MXene represented by $M_{n+1}X_n$, may be manufactured by selectively removing an A element from an MAX material represented by $M_{n+1}AX_n$, through a chemical etching method. The A element may represent an A group element such as Al, Si, P, S, Ga, Ge, As, Cd, In, Sn, Tl or Pb.

In an exemplary embodiment, $Ti_3C_2$ may be used as MXene, and the $Ti_3C_2$ may be obtained by removing Al from titanium-aluminum-carbide ($Ti_3ClC_2$) through a chemical etching method. However, exemplary embodiments of the present invention are not limited thereto, and various MXene may be used.

For example, a surface of the MXene may be charged positively or negatively. In another exemplary embodiment, the MXene may be reduction-treated so that a surface of the MXene may have a neutral charge.

In an exemplary embodiment, a thermoelectric material powder, MXene having a particle shape, and a solvent may be mixed, and then may be stirred by supersonic wave or the like. The mixture may be dried to obtain a thermoelectric material powder coated with MXene. In an exemplary embodiment, the solvent may include an alcohol-based solvent such as anhydrous ethanol.

A content of the MXene may be properly selected in a range of 0 to 100% by weight depending on a purpose of a thermoelectric element or the like. Preferably, a content of the MXene may be 0.01% by weight to 1% by weight based on a total weight of the thermoelectric material powder and the MXene. When a content of the MXene is excessively small or large, a thermoelectric ability of the thermoelectric composite material may be reduced.

For example, as illustrated in FIG. 2, the thermoelectric material powder may have a core-shell structure including a core 110 and a shell 120. The core 110 includes a thermoelectric material, and the shell 120 includes MXene.

Thereafter, the thermoelectric material powder coated with MXene (S10) is press-sintered (S20).

In an exemplary embodiment, the thermoelectric material powder coated with MXene may be disposed in a mold and shaped at a room temperature to obtain a compact body having a bulk shape.

For example, the thermoelectric material powder coated with MXene may be disposed in the mold and pressed to obtain the compact body. The compact body may have various shapes such as a rectangular column, a cylinder or the like, depending on a shape of the mold. For example, the compact body may be shaped at a room temperature, which may be about 20° C. to 30° C., to 500° C. under a pressure of 5 MPa to 500 MPa.

Thereafter, the compact body may be press-sintered. For example, the compact body may be press-sintered through a spark plasma sintering method, a hot press method, a cold press method, a hot extrusion method or the like, however, exemplary embodiments of the present invention are not limited thereto.

In an exemplary embodiment, the compact body may be press-sintered through a spark plasma sintering method. For example, the compact body may be press-sintered under a pressure of 5 MPa to 500 MPa at a temperature equal to or less than 500° C. for 10 hours. However, exemplary embodiments of the present invention are not limited thereto, for example, the temperature may be changed depending on materials of the powder.

Thereafter, the sintered body may be heated. Through heat treatment, a thermoelectric ability of the sintered body may be increased. For example, the heat treatment may be performed in vacuum or in an inert gas atmosphere, at a temperature equal to or less than a melting point, for 1 to 50 hours.

In an exemplary embodiment, MXene is coated on a thermoelectric material powder, and the thermoelectric material powder coated with the MXene is press-sintered to form a thermoelectric composite material. Thus, the thermoelectric composite material includes MXene inserted at a boundary of a crystal grain consisting of a thermoelectric material. For example, as illustrated in FIG. 3, an MXene layer 220 may surround a crystal grain 210. FIG. 3 is referred for explanation, and exemplary embodiments are not limited thereto. For example, the MXene may not form a continuous layer, but, MXene particles may be irregularly dispersed along a boundary of a crystal grain.

The above structure may increase scattering of phonons. Thus, a thermal conductivity may be decreased. Furthermore, since MXene has a high electrical conductivity, an electrical conductivity of the thermoelectric composite material including MXene may be increased. For example, the MXene may for a high-conductive secondary phase at a boundary of a crystal grain.

In another exemplary embodiment, the thermoelectric composite material may include a conductive polymer. For example, the conductive polymer may include polypyrrole, polyaniline, polycarbazole, polythiophene, poly(3-hexylthiophene) (P3HT), poly(3,4-ethylenedioxythiophene) (PEDOT), PEDOT:poly(styrene sulfonate) (PSS), or a combination thereof.

For example, the thermoelectric composite material may include MXene particles dispersed in a matrix of the conductive polymer. The thermoelectric composite material may have great flexibility. Furthermore, an electrical conductivity and a thermoelectric ability of the thermoelectric composite material may be increased by the MXene particles.

According to exemplary embodiments, MXene is inserted at a boundary of a crystal grain in a thermoelectric material. Thus, a thermal conductivity of the thermoelectric material may be reduced, and an electrical conductivity of the thermoelectric material may be increased. Therefore, a thermoelectric ability and a mechanical property of the thermoelectric material may be improved.

Figure 4:
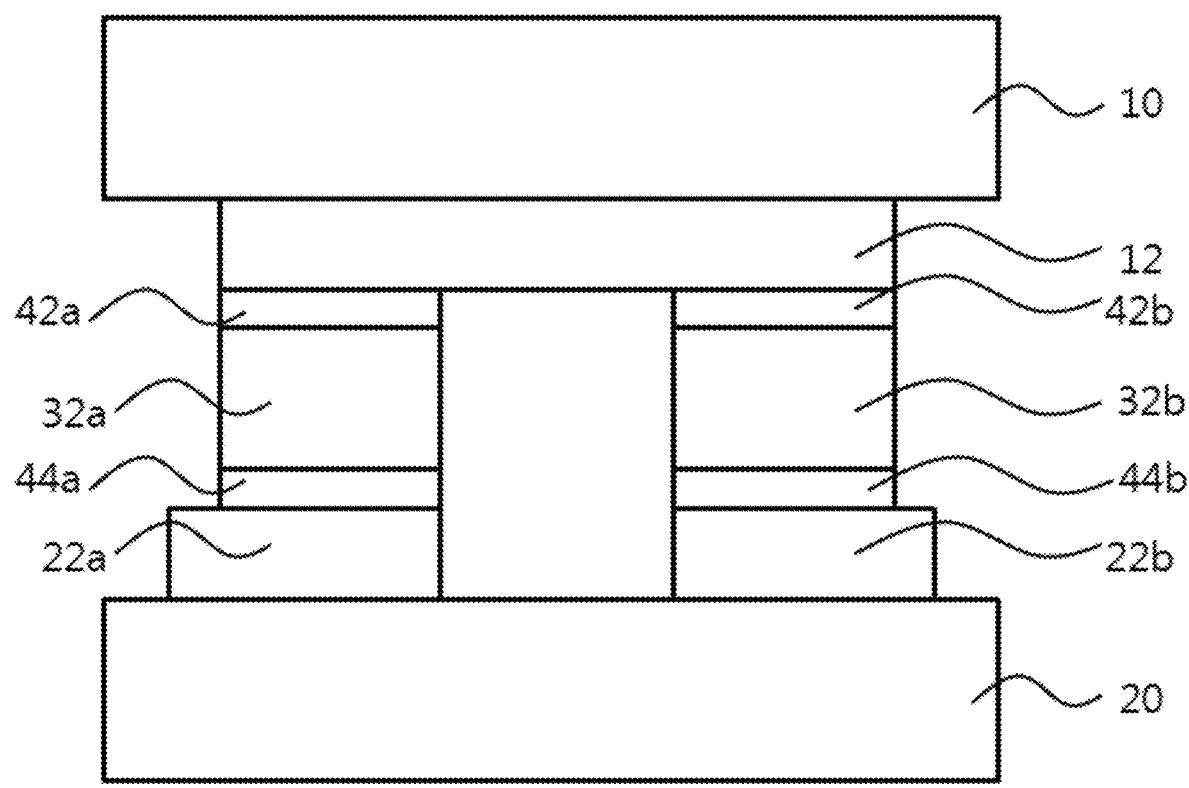
FIG. 4 is a cross-sectional view illustrating a thermoelectric module according to an exemplary embodiment.

FIG. 4 is a cross-sectional view illustrating a thermoelectric module according to an exemplary embodiment.

Referring to FIG. 4, a thermoelectric module according to an exemplary embodiment may include a first substrate 10, a second substrate 20 spaced apart from the first substrate 10, a first electrode 12 and a second electrode 22a and 22b, which are disposed between the first substrate 10 and the second substrate 20, and a thermoelectric part 32a and 32b disposed between the first electrode 12 and the second electrode 22a and 22b In an exemplary embodiment, a first barrier layer 42a and 42b may be disposed between the first electrode 12 and the thermoelectric part 32a and 32b. Furthermore, a second barrier layer 44a and 44b may be disposed between the second electrode 22a and 22b and the thermoelectric part 32a and 32b. The barrier layers may protect the thermoelectric part 32a and 32b.

The first substrate 10 and the second substrate 20 may include an insulating material. For example, the first substrate 10 and the second substrate 120 may include alumina, sapphire, silicon, silicon nitride, silicon carbide, silicon carbide aluminum, quartz, polymer or the like. The polymer may include polyimide, polyamide, polycarbonate, polyethylene terephthalate, polyacryl or the like. These may be used each alone or in a combination thereof. The first substrate 10 and the second substrate 20 may include a same material, or different materials.

In an exemplary embodiment, the thermoelectric module may include a first thermoelectric part 32a and a second thermoelectric part 32b, which are spaced apart from each other. First ends of the first thermoelectric part 32a and the second thermoelectric part 32b may be electrically connected to the first electrode 12 in common, and second ends of the first thermoelectric part 32a and the second thermoelectric part 32b may be electrically connected to a pair of the second electrodes 22a and 22b, which are spaced apart from each other, respectively.

In an exemplary embodiment, the first thermoelectric part 32a and the second thermoelectric part 32b may be doped to have different types. For example, the first thermoelectric part 32a may be doped with n-type impurities, and the second thermoelectric part 32b may be doped with p-type impurities.

For example, the first electrode 12 may include a metal such as nickel, titanium, copper, platinum, gold, silver or the like. Furthermore, the first electrode 12 may further include a metal compound such as nickel phosphide, titanium nitride, zinc oxide or the like. These may be used each alone or in a combination thereof. In an exemplary embodiment, the first electrode 12 may include copper. The second electrode 22a and 22b may include a same material as the first electrode 12, or a different material from the first electrode 12.

The barrier layers may include a different material from the first electrode 12 or the second electrode 22a and 22b. For example, the barrier layers may include a metal such as nickel, titanium, copper, platinum, gold, silver, molybdenum, tin, zirconium, niobium or tungsten, an alloy thereof or a metal compound thereof. For example, the metal compound may include nickel phosphide, titanium nitride, zinc oxide or the like. In an exemplary embodiment, the barrier layers may include a material having a thermal expansion coefficient smaller than that of the first electrode 12. For example, when the first electrode 12 or the second electrode 22a and 22b includes copper, the barrier layers may include other material than copper. For example, the barrier layers may include nickel, titanium, tin, zirconium, an alloy thereof or a metal compound thereof.

In an example embodiment, the first thermoelectric part 32a and the second thermoelectric part 32b include a thermoelectric composite material including MXene inserted at a boundary of a crystal grain. Thus, the thermoelectric module may have an improved thermoelectric ability.

Hereinafter, a thermoelectric composite material and a method for manufacturing the thermoelectric composite material will be explained with reference to particular examples.

Example 1

Preparing Thermoelectric Material Powder

P-type thermoelectric material power having a composition of $Bi_{0.4}Sb_{1.6}Te_3$ and having a size of 200 nm to 400 nm was prepared through mechanical alloying and ball-milling, Preparing MXene After 10 ml of HF solution (content: 50% by weight) was put in a 100 ml polypropylene container, 1 g of $Ti_3AlC_2$ was slowly added to the HF solution. Thereafter, the mixture was stirred for 4 hours at a room temperature to selectively remove aluminum from $Ti_3AlC_2$. Thereafter, the mixture was centrifuged by a centrifugal separator with 3,500 rpm for 5 minutes to remove HF. Thereafter, water was added thereto, and the mixture was stirred and centrifuged to remove a water solution including HF. The above steps were repeated until a pH of the mixture became 6, to sufficiently remove remaining HF. The remaining solution was dried to obtain MXene ($Ti_3C_2$). The obtained MXene particles had a plate shape having about 600 nm of a maximum diameter and 10 nm of a thickness.

Coating MXene

The obtained MXene ($Ti_3C_2$) and the obtained $Bi_{0.4}Sb_{1.6}Te_3$ powder were mixed such that a content of the MXene was varied in a range of 0.1% by weight to 1.0% by weight. Thereafter, anhydrous ethanol was added thereto, and a dispersion process was performed with a supersonic wave for 1 hour. Thereafter, the mixture was put in an drying oven, and fully dried at 100° C. for 24 hours to obtain a thermoelectric material powder ($Bi_{0.4}Sb_{1.6}Te_3$) coated with MXene ($Ti_3C_2$).

Press-Sintering

The thermoelectric material powder ($Bi_{0.4}Sb_{1.6}Te_3$) coated with MXene ($Ti_3C_2$) was put in a mold and pressed for shaping at a room temperature to obtain a bulk shaped body.

The shaped body was press-sintered by spark plasma sintering method under a pressure of 70 Mpa at a temperature of 450° C. for 5 minutes to obtain an ingot.

Figure 5:
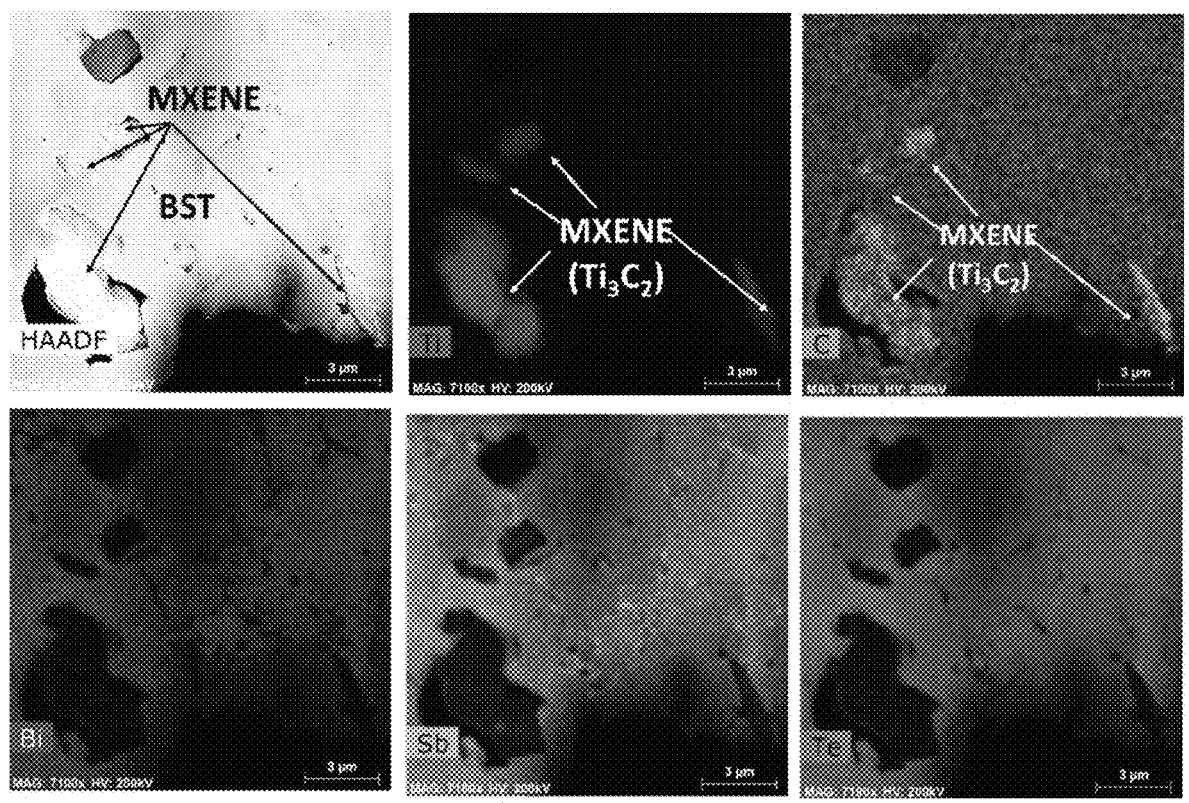
FIG. 5 is a transmission electron microscopy (TEM) picture and an energy dispersive x-ray spectroscopy (EDAX) picture, of the thermoelectric composite material obtained according to Example 1.
Figure 6:
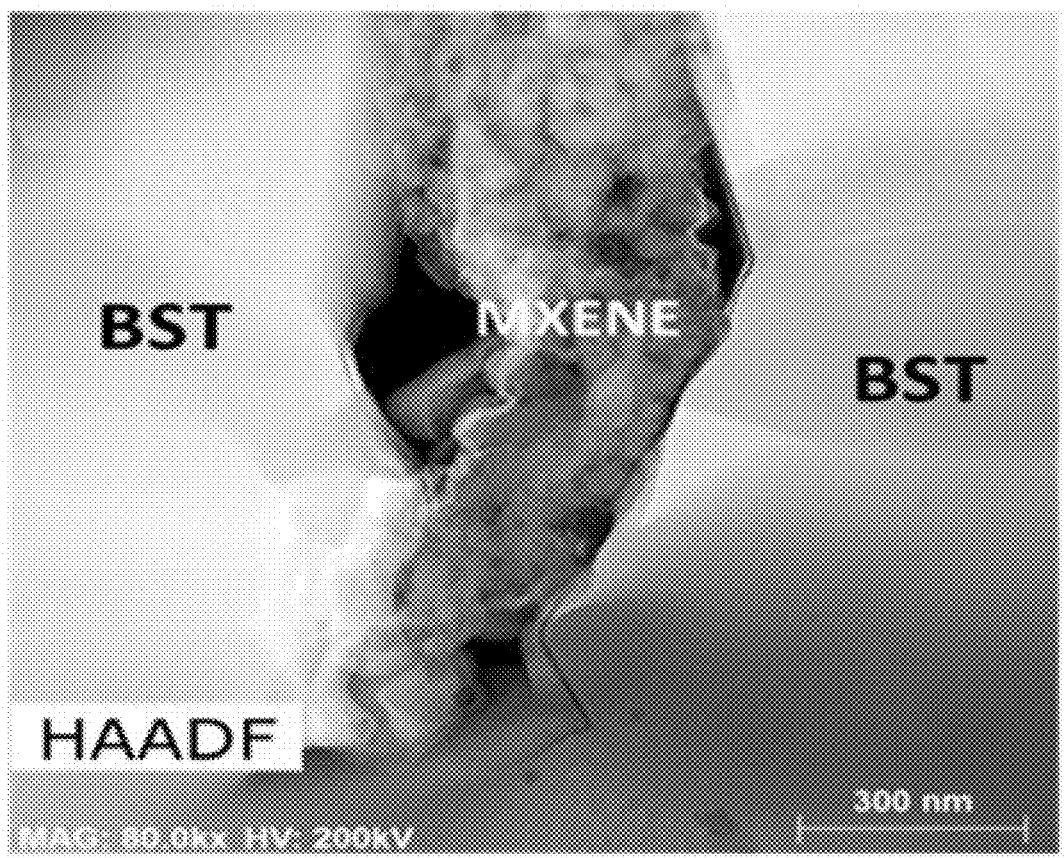
FIG. 6 is a high-angle annular dark-field (HAADF) TEM image of the thermoelectric composite material obtained according to Example 1.

FIG. 5 is a transmission electron microscopy (TEM) picture and an energy dispersive x-ray spectroscopy (EDAX) picture, of the thermoelectric composite material obtained according to Example 1. FIG. 6 is a high-angle annular dark-field (HAADF) TEM image of the thermoelectric composite material obtained according to Example 1. In the thermoelectric composite material, a content of MXene ($Ti_3C_2$) is 0.7% by weight.

Referring to FIGS. 5 and 6, it can be noted that MXene (MXENE) having a nano size is clearly disposed at a boundary of $Bi_{0.4}Sb_{1.6}Te_3$ crystal grain (BST). Furthermore, referring to EDAX analysis, it can be noted that MXene ($Ti_3C_2$) was not decomposed in the process of press-sintering but maintained with a particle shape.

According to the above, it can be expected that an electrical conductivity of the thermoelectric composite material may be increased. Since MXene has a small thickness, it may function as a heat resistant medium without hindering flowing of electricity. Increase of an electrical conductivity of the thermoelectric composite material may increase a power factor, and a low thermal conductivity may increase ZT. Thus, a thermoelectric ability may be increased.

FIGS. 7A, 7B, 7C and 7D are graphs showing Seebeck coefficients, electrical conductivity, thermal conductivity and ZT of the thermoelectric composite materials obtained according to Example 1 and Comparative Example. In FIGS. 7A, 7B, 7C and 7D, $Bi_{0.4}Sb_{1.6}Te_3$+MXene($Ti_3C_2$) represents a thermoelectric composite material including MXene, and $Bi_{0.4}Sb_{1.6}Te_3$ represents a thermoelectric material without MXene, which is a mother material of the thermoelectric composite material.

Figure 7A:
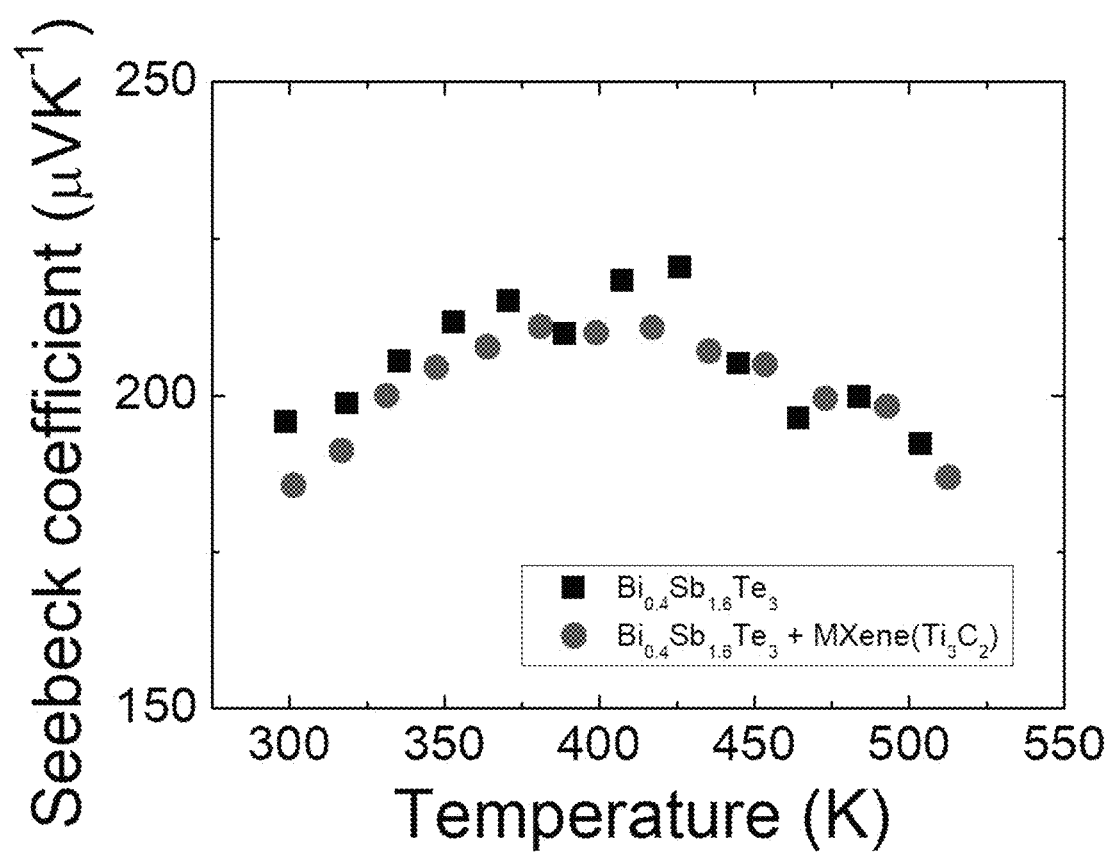
FIGS. 7A, 7B, 7C and 7D are graphs showing Seebeck coefficients, electrical conductivity, thermal conductivity and ZT of the thermoelectric composite materials obtained according to Example 1 and Comparative Example.
Figure 7B:
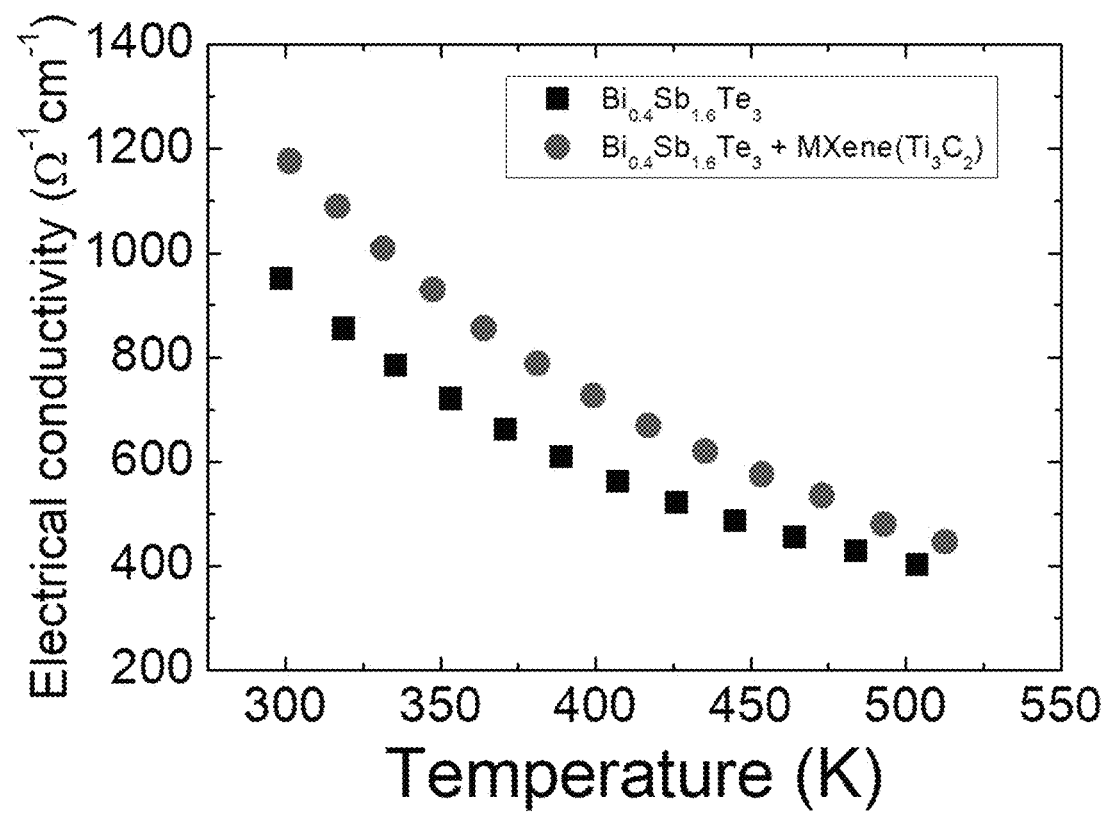
Figure 7C:
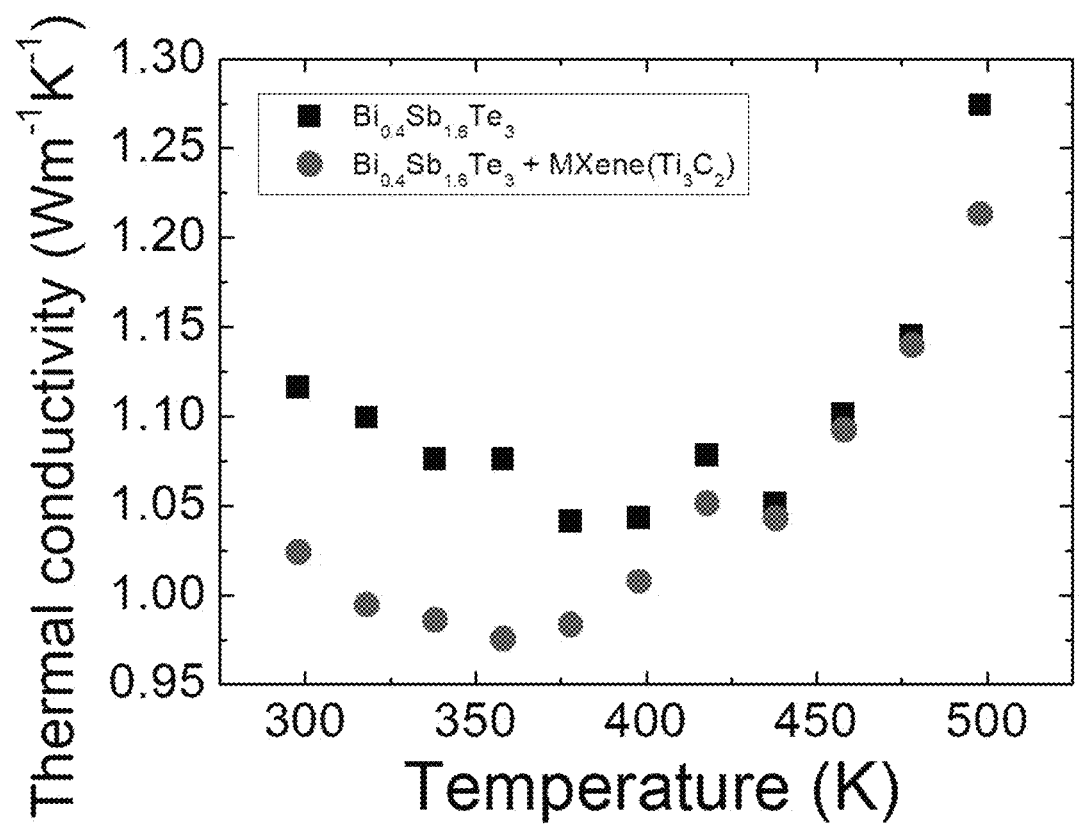
Figure 7D:
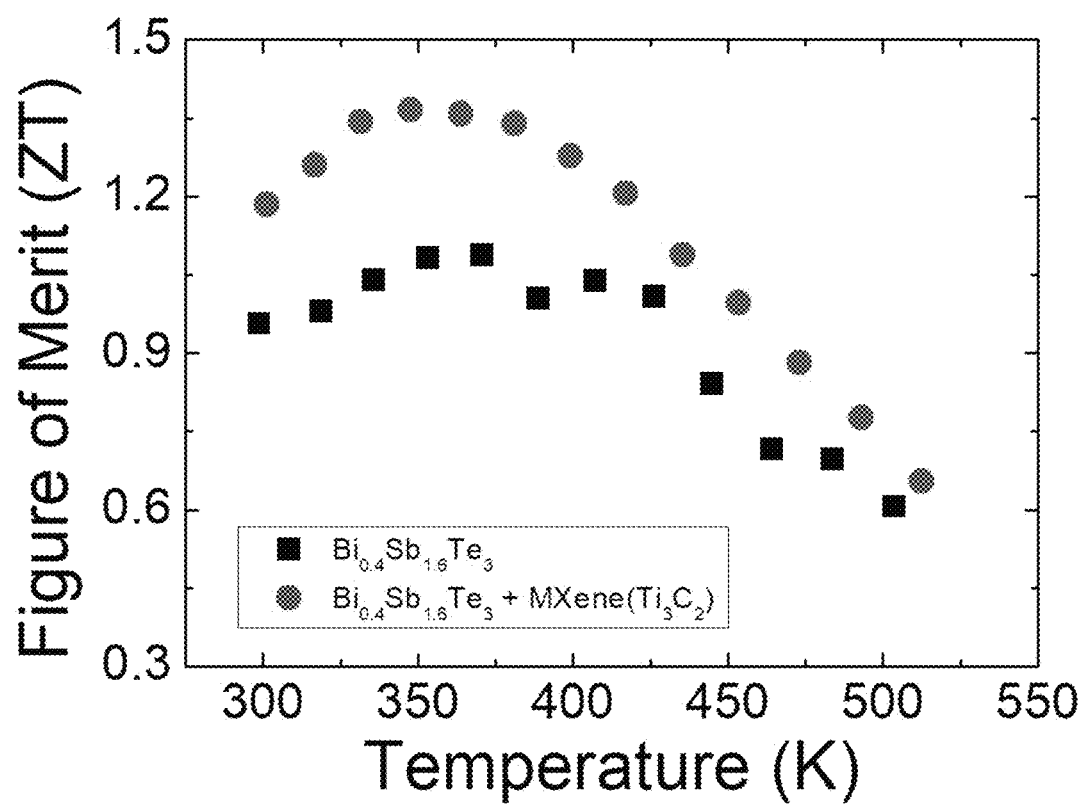

Referring to FIG. 7A, Seebeck coefficient of the thermoelectric composite material including MXene was similar to or lower than that of the thermoelectric material without MXene in an entire range of the measured temperature. Referring to FIG. 7B, an electrical conductivity of the thermoelectric composite material including MXene was increased with compared to the thermoelectric material without MXene. Referring to FIG. 7C, a thermal conductivity of the thermoelectric composite material including MXene was reduced with compared to the thermoelectric material without MXene. Referring to FIG. 7D, ZT of the thermoelectric composite material including MXene was increased with compared to the thermoelectric material without MXene by at most 40%.

Exemplary embodiments may be used for manufacturing a thermoelectric module for small-size generation, a thermoelectric module configured to cool or control a temperature of various apparatuses.

The foregoing is illustrative and is not to be construed as limiting thereof. Although a few exemplary embodiments have been described, those skilled in the art will readily appreciate that many modifications are possible in the exemplary embodiments without materially departing from the novel teachings, aspects, and advantages of the invention. Accordingly, all such modifications are intended to be included within the scope of this disclosure.

What is claimed is:

1. A thermoelectric composite material, comprising:
    a thermoelectric material comprising crystal grains; and
    a MXene inserted at boundaries of the crystal grains consisting of the thermoelectric material.

2. The thermoelectric composite material of claim 1, wherein the thermoelectric material includes a material selected from the group consisting of a chalcogenide, an antimonide, a silicide, a half-Heusler compound, an oxide, and combinations thereof.

3. The thermoelectric composite material of claim 1, wherein the thermoelectric material includes a material selected from the group consisting of a Bi—Te compound, a Sb—Te compound, a Bi—Te—Se compound, a Bi—Sb—Te compound, a Bi—Sb—Te—Se compound, and combinations thereof.

4. The thermoelectric composite material of claim 1, wherein the MXene is an inorganic compound having a two-dimensional shape and is represented by:

$$M_{n+1}X_n,$$

where M represents Ti, Zr, Hf, V, Cr, Mn, Sc, Mo, Nb, Ta or a combination thereof, X represents C, N or a combination thereof, and where n is a natural number of 1 to 3.

5. The thermoelectric composite material of claim 1, wherein the MXene forms a continuous thin film surrounding the crystal grains.

6. The thermoelectric composite material of claim 1, wherein the MXene is irregularly disposed along the boundaries of the crystal grains.

7. A method of manufacturing a thermoelectric composite material, the method comprising:
    coating MXene on a surface of a thermoelectric material powder comprising crystal grains; and
    sintering the thermoelectric material powder coated with the MXene to form a sintered body including the MXene inserted at boundaries of the crystal grains consisting of the thermoelectric material.

8. The method of claim 7, wherein the thermoelectric material powder includes a material selected from the group consisting of a chalcogenide, an antimonide, a silicide, a half-Heusler compound, an oxide, and combinations thereof.

9. The method of claim 7, wherein the thermoelectric material powder includes a material selected from the group consisting of a Bi—Te compound, a Sb—Te compound, a Bi—Te—Se compound, a Bi—Sb—Te compound, a Bi—Sb—Te—Se compound, and combinations thereof.

10. The method of claim 7, wherein the MXene is an inorganic compound having a two-dimensional shape and represented by:

$$M_{n+1}X_n,$$

where M represents Ti, Zr, Hf, V, Cr, Mn, Sc, Mo, Nb, Ta or a combination thereof, X represents C, N or a combination thereof, and n is a natural number of 1 to 3.

11. The method of claim 7, wherein coating the MXene on the surface of the thermoelectric material powder comprises:
    mixing and stirring the thermoelectric material powder, the MXene and a solvent to provide a mixture; and
    drying the mixture.

12. The method of claim 11, wherein the solvent includes an alcohol-based solvent.

13. The method of claim 11, wherein a content of the MXene is present in an amount ranging from 0.01% by weight to 1% by weight based on total weight of the thermoelectric material powder and the MXene.

* * * * *